US009589641B2

(12) United States Patent
Kim (10) Patent No.: US 9,589,641 B2
(45) Date of Patent: Mar. 7, 2017

(54) SEMICONDUCTOR MEMORY DEVICE (71) Applicant: SK hynix Inc., Gyeonggi-do (KR)

(72) Inventor: Min Su Kim, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 268 days.

(21) Appl. No.: 14/515,255

(22) Filed: Oct. 15, 2014

(65) Prior Publication Data

US 2015/0332743 A1 Nov. 19, 2015

(30) Foreign Application Priority Data

May 14, 2014 (KR) ........................ 10-2014-0057999

(51) Int. Cl.
*G06F 12/00* (2006.01)
*G11C 16/06* (2006.01)
*G11C 7/10* (2006.01)
*G11C 16/08* (2006.01)
*G11C 16/10* (2006.01)

(52) U.S. Cl.
CPC .............. *G11C 16/06* (2013.01); *G11C 7/106* (2013.01); *G11C 7/109* (2013.01); *G11C 7/1039* (2013.01); *G11C 7/1072* (2013.01); *G11C 7/1087* (2013.01); *G11C 16/08* (2013.01); *G11C 16/10* (2013.01)

(58) Field of Classification Search
CPC ....... G11C 16/06; G11C 7/1039; G11C 7/106; G11C 7/1072; G11C 7/1087

USPC ......................................................... 711/105
See application file for complete search history.

(56) References Cited

U.S. PATENT DOCUMENTS 6,366,524 B1 * 4/2002 Abedifard ............ G11C 7/1072
365/230.03

FOREIGN PATENT DOCUMENTS

KR 100968443 7/2010
KR 101097437 12/2011

* cited by examiner

*Primary Examiner* — Brian Peugh
*Assistant Examiner* — Edmund Kwong
(74) *Attorney, Agent, or Firm* — IP & T Group LLP (57) ABSTRACT A semiconductor memory device includes a first page buffer block and a second page buffer block corresponding to a first memory bank and a second memory bank, respectively, an input/output control circuit suitable for transferring input data to data lines, a first column decoder and a second column decoder suitable for latching the input data transferred through the data lines to the first page buffer block and the second page buffer block, respectively, based on a column address transferred through address lines that are shared by the first and second column decoders, and a control signal generation circuit suitable for generating a plurality of page buffer selection signals to control the first and second column decoders to selectively perform data latch operations on the first and second page buffer blocks.

18 Claims, 9 Drawing Sheets

SEMICONDUCTOR MEMORY DEVICE

CROSS-REFERENCE TO RELATED APPLICATION

The present application claims priority to Korean patent application number 10-2014-0057999, filed on May 14, 2014, the entire disclosure of which is incorporated herein in its entirety by reference.

BACKGROUND

Field of Invention

Various embodiments of the present invention generally relate to an electronic device, and more particularly, to a semiconductor memory device.

Description of Related Art

Semiconductor memory devices are classified into volatile memory devices and nonvolatile memory devices.

Volatile memory devices operate at high write and read speeds, but they lose stored data when the power is off. Thus, nonvolatile memory devices are used to retain data regardless of power on/off conditions. Examples of the nonvolatile memory include a read only memory (ROM), a mask ROM (MROM), a programmable ROM (PROM), an erasable programmable ROM (EPROM an electrically erasable and programmable ROM (EEPROM) a flash memory, a phase-change random access memory (PRAM), a magnetic RAM (MRAM), a resistive RAM (RRAM) and a ferroelectric RAM (FRAM). Flash memories are categorized into NOR or NAND type.

Flash memories have the advantages of both a RAM and a ROM. For example, flash memories may be freely programmed and erased similar to a RAM, and similar to a ROM, flash memories may retain the stored data even when they are not powered. Hash memories have been widely used as the storage media for portable electronic devices, such as, digital cameras, personal digital assistants (PDAs) and MP3 players.

SUMMARY

Various embodiments of the present invention are directed to a semiconductor memory device capable of achieving a higher degree of integration and reducing power consumption by reducing a size of a data input circuit of the semiconductor memory device.

According to an embodiment of the present invention, a semiconductor memory device may include a first page buffer block and a second page buffer block corresponding to a first memory bank and a second memory bank, respectively, an input/output control circuit suitable for transferring input data to data lines, a first column decoder and a second column decoder suitable for latching the input data transferred through the data lines to the first page buffer block and the second page buffer block, respectively, based on a column address transferred through address lines that are shared by the first and second column decoders, and a control signal generation circuit suitable for generating a plurality of page buffer selection signals to control the first and second column decoders to selectively perform data latch operations on the first and second page buffer blocks.

According to an embodiment of the present invention, a semiconductor memory device may include a first memory bank and a second memory bank each including a memory unit and a page buffer unit, an input/output pad unit suitable for receiving an input data, a command signal, and an address signal, a first column decoder and a second column decoder suitable for controlling data latch operations of page buffer units of the first memory bank and the second memory bank, respectively, based on a plurality of page buffer selection signals and a column address, a control signal generation circuit suitable for generating the page buffer selection signals to block a data latch operation of the page buffer unit corresponding to the first or second column decoder according to a data input order, an address counter suitable for transferring the column address through an address line shared by the first and second column decoders, and an input/output control circuit suitable for transferring the input data to a data line coupled to the page buffer units of the first and second memory banks.

According to an embodiment of the present invention, a semiconductor memory device may include a plurality of memory bank units each including a memory unit and a page buffer unit, a plurality of column decoders corresponding to the respective memory bank units and each suitable for controlling a data latch operation of the corresponding page buffer unit based on a column address and page buffer selection signals, a control signal generation circuit suitable for generating the page buffer selection signals to activate data latch operations of the page buffer units, based on a command signal, and an address counter suitable for counting an internal clock to generate the column address and transferring the column address through an address line shared by the column decoders.

DETAILED DESCRIPTION

Hereinafter, various exemplary embodiments of the present invention will be described in detail with reference to the accompanying drawings. The figures are provided to enable those of ordinary skill in the art to make and use the present invention according to the exemplary embodiments of the present invention.

Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
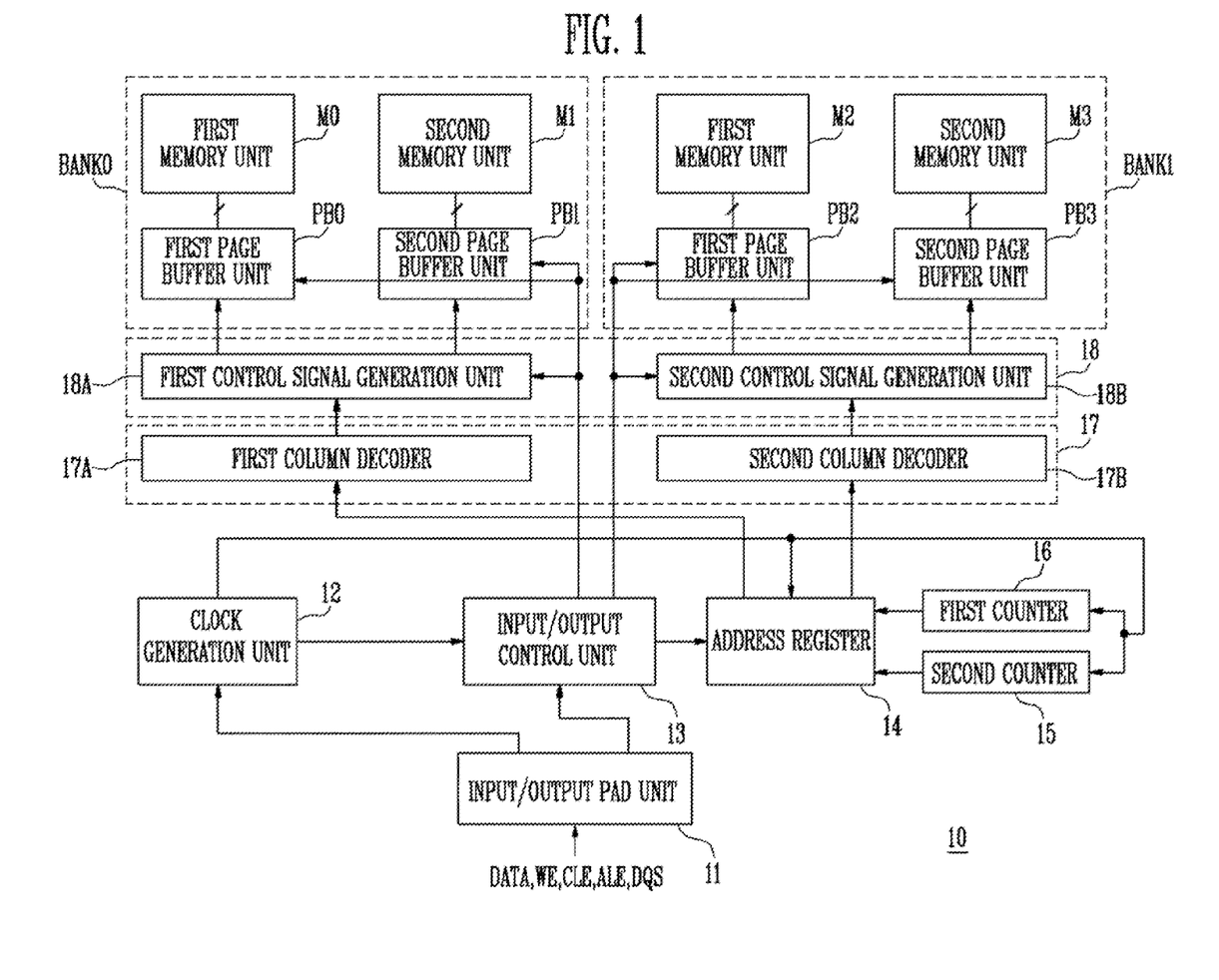
FIG. 1 is a block diagram illustrating a semiconductor memory device.

FIG. 1 is a block diagram illustrating a semiconductor memory device 10.

Referring to FIG. 1, the semiconductor memory device 10 may include an input/output pad unit 11, a clock generation unit 12, an input/output control unit 13, an address register 14, first and second counters 15 and 16, a column decoder unit 17, a control signal generation circuit 18 and first and second memory bank units BANK0 and BANK1.

The input/output pad unit 11 may receive input data DATA, a plurality of data input signals WE, CLE, and DQS, and an address signal ALE, which are input from an external device, and transfer the received data and signals to the respective components.

The clock generation unit 12 may generate a data input clock CLK that toggles at a predetermined period response to the data input signal WE received from the input/output pad unit 11.

The input/output control unit 13 may generate a control signal to control the control signal generation unit 18 and a control signal to input the data to first and second page buffer units PB0, PB1 PB2, and PB3 included in the first and second memory bank units BANK0 and BANK1 based on the data input signals WE, CLE, and DQS received from the input/output pad unit 11.

The first and second counters 15 and 16 may count the data input clock generated by the clock generation unit 12 to output counting signals corresponding to first and second memory banks.

The address register 14 may synchronize addresses with the counting signals output by the first and second counters 15 and 16, temporarily store the addresses, and transfer the addresses to a first column decoder unit 17A and a second column decoder unit 17B included in the column decoder unit 17.

The column decoder unit 17 may include the first column decoder unit 17A corresponding to the first memory bank unit BANK0 and the second column decoder unit 17B corresponding to the second memory bank unit BANK1. The first column decoder unit 17A and the second column decoder unit 17B may output column decoding signals to control the control signal generation unit 18 in response to address signals output by the address register 14.

The control signal generation unit 18 may include a first control signal generation unit 18A corresponding to the first memory bank unit BANK0 and a second control signal generation unit 18B corresponding to the second memory bank unit BANK1. The first control signal generation unit 18A and the second control signal generation unit 18B may control the data so that the data may be input to a page buffer unit selected from among the first and second page buffer units PB0, PB1, PB2, and PB3 included in the first memory bank unit BANK0 and the second memory bank unit BANK1 based on the column decoding signals output by the column decoder unit 17.

The first memory bank unit BANK0 may include a first memory unit M0, a second memory unit M1, a first page buffer unit PB0 corresponding to the first memory unit M0, and a second page buffer unit PB1 corresponding to the second emery unit M1. The second memory bank unit BANK1 may include a first memory unit M2, a second memory unit M3, a first page buffer unit PB2 corresponding to the first memory unit M2, and a second page buffer unit PB3 corresponding to the second memory unit M3. The first and second page buffer units PB0, PB1, PB2, and PB3 may temporarily store the input data DATA, input through the input/output control unit 13, based on the control signals generated by the control signal generation circuit 18. Additionally, during a program operation, the first memory units M0 and M2 and the second memory units M1 and M3 may be programmed with the data temporarily stored in the first page buffer units PB0 and PB1 and the second page buffer units PB2 and PB3, respectively.

As described above, the semiconductor memory device 10 requires a data input circuit including the first counter 15, the second counter 16, the first control signal generation unit 18A corresponding to the first memory bank unit BANK0, and the second control signal generation unit 18B corresponding to the second memory bank unit BANK1. Thus, the data input circuit occupies a large circuit area. Furthermore, as the number of memory banks increases, more counters and more control signal generation units may be provided. As a result, the circuit area occupied by the data input circuit may be increased.

Figure 2:
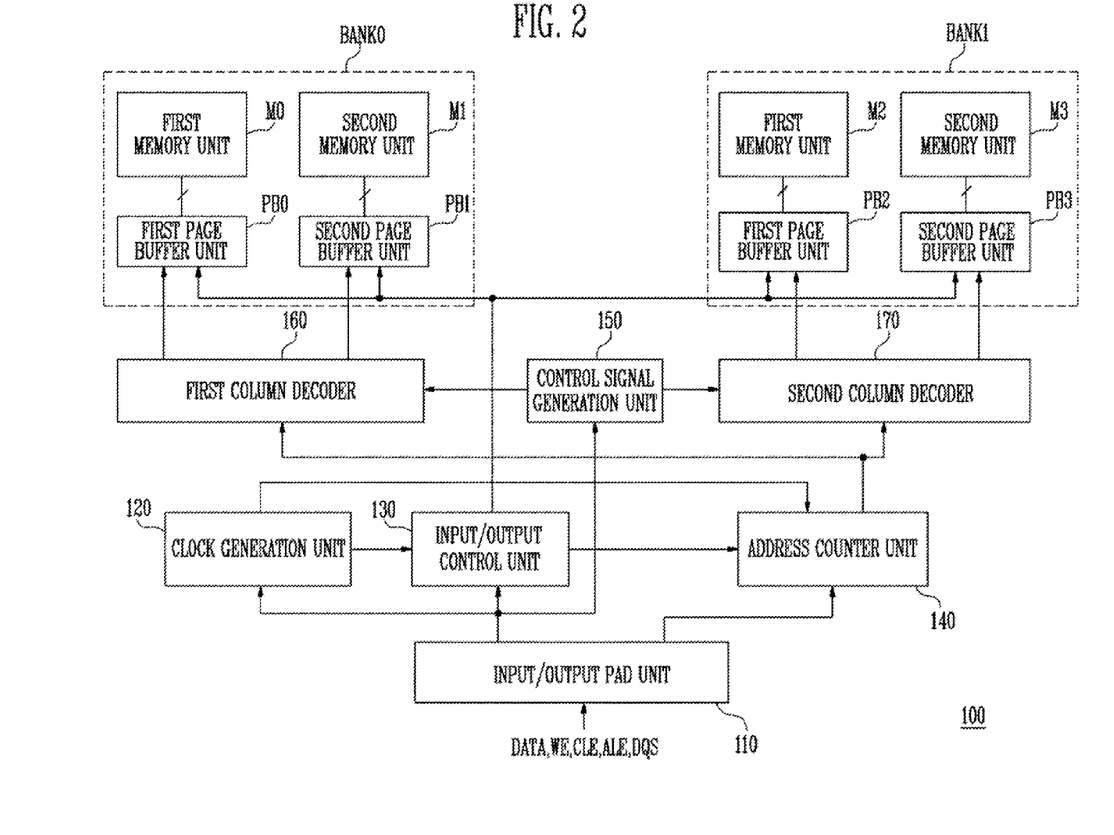
FIG. 2 is a block diagram illustrating a semiconductor memory device according to an embodiment of the present invention.

FIG. 2 is a block diagram illustrating a semiconductor memory device 100 according to an embodiment of the present invention.

Referring to FIG. 2, the semiconductor memory device 100 may include an input/output pad unit 110, a clock generation unit 120, an input/output control circuit 130, an address counter unit 140, a selection signal generation circuit 150, first and second column decoders 160 and 170, and first and second memory bank units BANK0 and BANK1.

The input/output pad unit 110 may receive input data DATA, command signals WE, CLE and DQS, and an address signal ALE, which are input from an external device, to perform a data input operation and transfer the received data and signals to the respective components. The input/output pad 110 may include a control circuit. The control circuit may generate and transfer new internal control signals to the respective components in response to the command signals WE, CLE and DQS and the address signal ALE.

The clock generation unit 120 may generate an internal clock and data input clocks that toggle at predetermined period based on the command signals received from the input/output pad unit 110.

The input/output control circuit 130 may transfer the input data DATA to data lines coupled to the first and second memory bank units BANK0 and BANK1 in response to the command signals received from the input/output pad unit 110 and the data input clocks generated by the clock generation unit 120. Additionally, during the data input operation, the input/output control circuit 130 may transfer the data to selected data lines, for example, the data lines coupled to the first memory bank unit BANK0, and block a data transfer operation against unselected data lines, for example, the data lines coupled to the second memory bank unit BANK1.

The address counter unit 140 may count the internal dock generated by the clock generation unit 120 to generate a counting signal, and generate a column address based on the command signals and the counting signal received from the input/output pad unit 110. The generated column address may be transferred to a first column decoder 160 and a second column decoder 170. The address counter unit 140 may transfer an integrated column address to the first column decoder 160 and the second column decoder 170, rather than different addresses corresponding to the first memory bank unit BANK0 and the second memory bank unit BANK1. Therefore, the address counter unit 140 may be composed of a single counter circuit, and the number of address lines coupled to the first column decoder 160 and the second column decoder 170 may be reduced.

The control signal generation circuit 150 may output control signals to control the first and second column decoders 160 and 170 based on the command signals input through the input/output pad unit 110. The control signal generation circuit 150 may control the first and second column decoders 160 and 170 to select some or all of the first and second page buffer units PB0, PB1, PB2, and PB3 included in the first and second memory bank units BANK0 and BANK1 so that the input data DATA, input through the input/output control circuit 130, may be input to some or all of the first and second page buffer units PB0, PB1, PB2, and PB3. The control signal generation circuit 150 may be composed of a single circuit regardless of the number of first and second memory bank units BANK0 and BANK1. Therefore, the size of the circuit may be reduced to increase a degree of integration. Moreover, since the circuit configuration is simplified power consumption may be reduced.

The first and second column decoders 160 and 170 may correspond to the first and second memory bank units BANK0 and BANK1, respectively. The first and second column decoders 160 and 170 may select either or both of the first and second memory banks BANK0 and BANK1 to activate the data input operation, based on the control signals output from the control signal generation circuit 150.

The first memory bank unit BANK0 may include a first memory unit M0, a second memory unit M1, a first page buffer unit PB0 corresponding to the first memory unit M0, and a second page buffer unit PB1 corresponding to the second memory unit M1. The second memory bank unit BANK1 may include a first memory unit M2, a second memory unit M3, a first page buffer unit PB2 corresponding to the first memory unit M2, and a second page buffer unit PB3 corresponding to the second memory unit M3. The first and second page buffer units PB0, PB1, PB2, and PB3 may temporarily store the input data DATA, input through the input/output control unit 130, based on the control signals generated by the control signal generation circuit 150.

Figure 3:
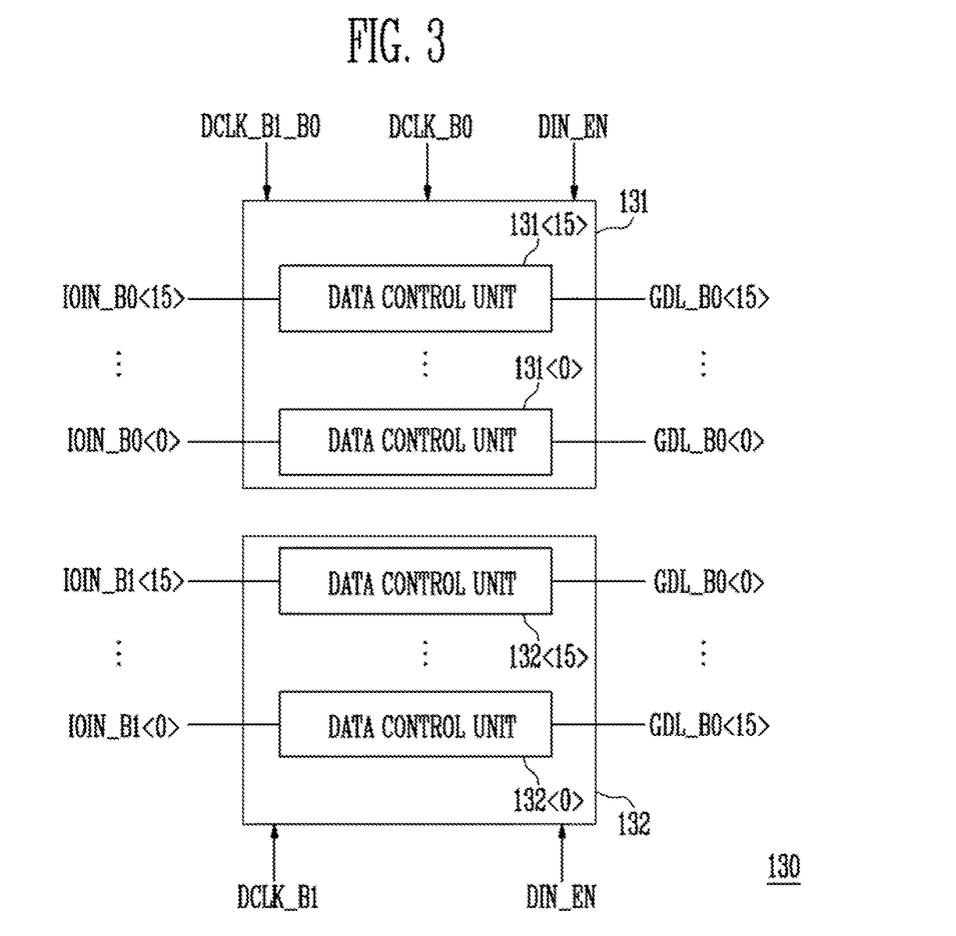
FIG. 3 is a detailed diagram of an input/output control circuit shown in FIG. 2.

FIG. 3 is a view illustrating the configuration of the input/output control circuit shown in FIG. 2.

Referring to FIG. 3, the input/output control circuit 130 may include a first data line control block 131 and a second data line control block 132.

The first data line control block 131 may be coupled between first local data lines IOIN_BO<15:0> and first global data lines GDL_B0<15:0>, activated in response to an data input activation signal DIN_EN and transfer or block the input data that are input to the first local data lines IOIN_BO<15:0> through the input/output pad unit 110, shown in FIG. 2, to the first global data lines GDL_B0<15:0> based on a data input clock DCLK_BO and a data input clock DCLK_B1_B0. The first data line control block 131 may correspond to the first memory bank BANK0, shown in FIG. 1.

The first data line control block 131 may include a plurality of data control units 131<15:0> coupled between the first local data lines IOIN_BO<15:0> and the first global data lines GDL_B0<15:0>. The data control units 131<15:0> may include the same circuit configuration.

The second data line control block 132 may be coupled between second local data lines IOIN_B1<15:0> and second global data lines GDL_B1<15:0>, activated in response to the data input activation signal DIN_EN, and transfer or block the input data that are input to the second local data lines IOIN_B1<15:0> through the input/output pad unit 110, shown in FIG. 2, to the second global data lines GDL_B1<15:0> based on a data input clock DCLK_B1. The second data line control block 132 may correspond to the second memory bank BANK1, shown in FIG. 1.

The second data line control block 132 may include a plurality of data control units 132<15:0> coupled between the second local data lines IOIN_B1<15:0> and the second global data lines GDL_B1<15:0>. The data control units 132<15:0> may have the same circuit configuration.

Figure 4:
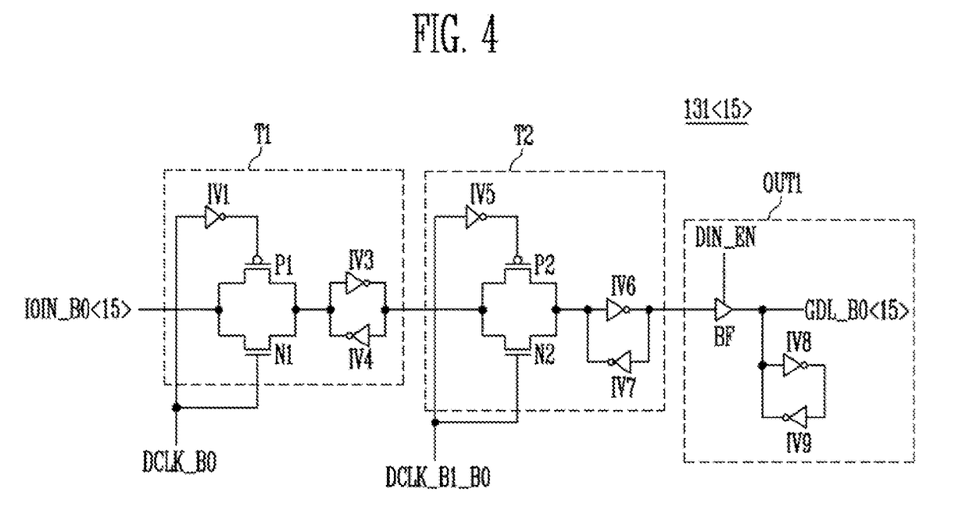
FIG. 4 is a detailed diagram of a data control block shown in FIG. 3.

FIG. 4 is a circuit diagram illustrating the data control block 131<15> shown in FIG. 3.

Referring to FIG. 4, the data control block 1<15> may include first and second transfer units T1 and T2 and an output unit OUT1.

The first transfer unit T1 may include pass transistors P1 and N1, latches IV3 and IV4 and an inverter IV1 coupled to the first local data line IOIN_B0<15>. The inverter IV1 may invert the data input clock DCLK_BO and transfer the inverted data input clock DCLK_BO to the pass transistor P1. Based on the inverted data input clock DCLK_BO and the data input clock DCLK_BO, the pass transistors P1 and N1 may transfer the input data that are input through the first local data line IOIN_B0<15>, to the latches IV3 and IV4, and the latches IV3 and IV4 may temporarily store the input data input through the pass transistors P1 and N1.

The second transfer unit T2 may include pass transistors P2 and N2 coupled to the first transfer unit T1, latches IV6 and IV7 and an inverter IV5. The inverter IV5 may invert the data input clock. DCLK_B1_BO and transfer the inverted data input clock DCLK_B1_BO to the pass transistor P2. Based on the inverted data input clock. DCLK_B1_BO and the data input clock DCLK_B1_BO, the pass transistors P2 and N2 may transfer the input data that are input through the first transfer unit T1, to the latches IV6 and IV7, and the latches IV6 and IV7 may temporarily store the input data input through the pass transistors P2 and N2.

The output unit OUT1 may include a buffer BF coupled between the second transfer unit. T2 and the first global data line GDL_B0<15> and latches IV8 and IV9 coupled to the first global data line B0<15>. The buffer BF may be activated based on the data input activation signal DIN_EN, and transfer the input data that are input through the second transfer unit T2, to the latches IV8 and IV9. The latches IV8 and IV9 may transfer the latched data to the first global data line GDL_B0<15>.

Figure 5:
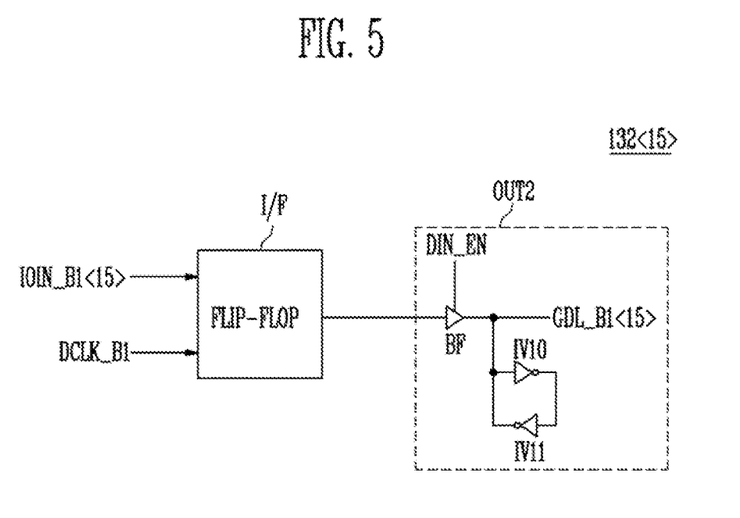
FIG. 5 is a detailed diagram of a data control block shown in FIG. 3.

FIG. 5 is a circuit diagram illustrating the data control block 132<15> shown in FIG. 3.

Referring to FIG. 5, the data control block 132<15> may include a flip-flop I/F coupled to the second local data line IOIN_B1<15>, and an output unit OUT2.

The flip-flop I/F may synchronize the input data, input through data input clock DCLK_B1, with the second local data line IOIN_B1<15>.

The output unit OUT2 may include the buffer BF coupled between the flip-flop I/F and the second global data line GDL_B1<15>, and latches IV10 and IV11 coupled to the second global data line GDL_B1<15>. The buffer BF may be activated based on the data input activation signal DIN_EN, transfer the input data that are input through the flip-flop I/F, to the latches IV10 and IV11, and the latches IV10 and IV11 may transfer the latched data to the second global data line GDL_B1<15>.

Figure 6:
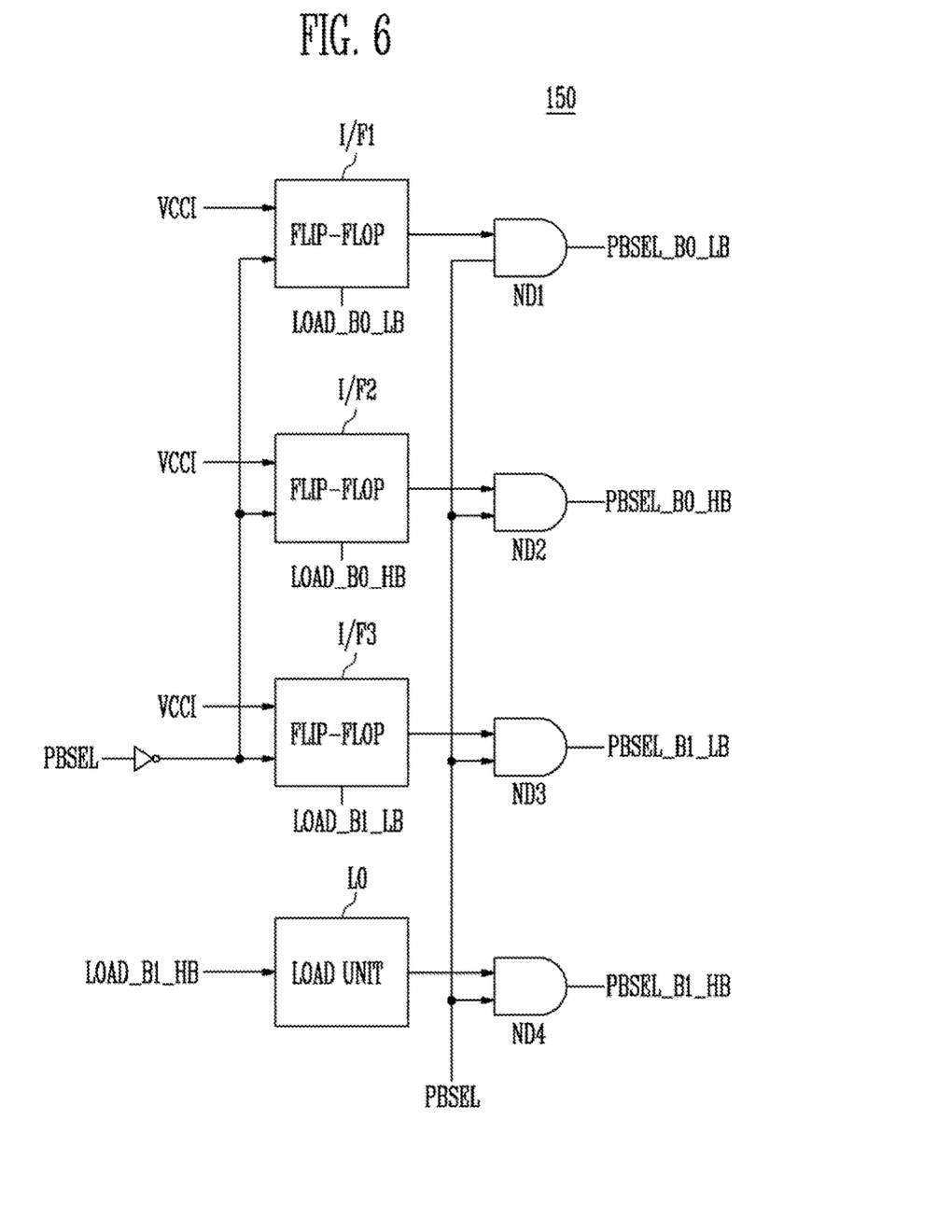
FIG. 6 is a detailed diagram of a control signal generation circuit shown in FIG. 2.

FIG. 6 is a circuit diagram illustrating the control signal generation circuit shown in FIG. 2.

Referring to FIG. 6, the control signal generation circuit 150 may include a plurality of flip-flops I/F1, I/F2, and I/F3, a load unit LO, and a plurality of logic gates ND1 to ND4.

The flip-flop I/F1 may be activated based on a first selection signal LOAD_B0_LB corresponding to a first memory of the first memory bank and output an output signal based on an inversion signal of a page buffer selection signal PBSEL and an internal power voltage VCCI. The logic gate ND1 may perform a logic operation on the output signal of the flip-flop I/F1 and the page buffer selection signal PBSEL to output a first page buffer selection signal PBSEL_B0_LB corresponding to the first memory of the first memory bank.

The flip-flop I/F2 may be activated based on a second selection signal LOAD_B0_HB corresponding to a second memory of the first memory bank and output an output signal based on the inversion signal of the page buffer selection signal PBSEL and the internal power voltage VCCI. The logic gate ND2 may perform a logic operation on the output signal of the flip-flop I/F2 and the page buffer selection signal PBSEL, and output a second page buffer selection signal PBSEL_B0_HB corresponding to the second memory of the first memory bank.

The flip-flop I/F3 may be activated based on a third selection signal LOAD_B1_LB corresponding to a first memory of the second memory bank, and output an output signal based on the inversion signal of the page buffer selection signal PBSEL and the internal power voltage VCCI. The logic gate ND3 may perform a logic operation on the output signal of the flip-flop I/F3 and the page buffer selection signal PBSEL, to output a third page buffer selection signal PBSEL_B1_LB corresponding to the first memory of the second memory bank.

The load unit LO may temporarily store and output a fourth selection signal LOAD_B1_HB corresponding to a second memory of the second memory bank. The logic gate ND4 may perform a logic operation on an output signal of the load unit LO and the page buffer selection signal PBSEL to output a fourth page buffer selection signal PBSEL_B1_HB corresponding to the second memory of the second memory bank.

Figure 7:
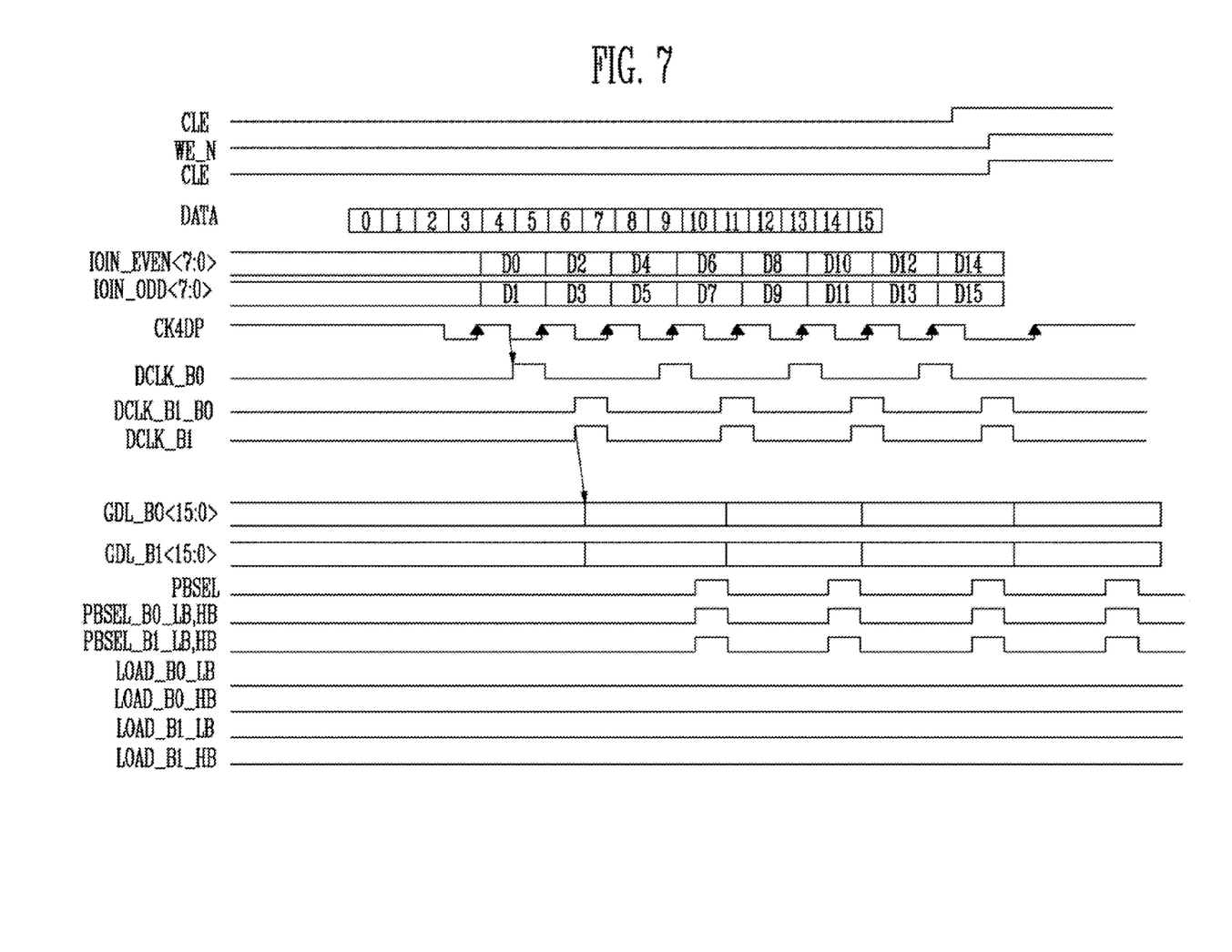
FIGS. 7 and 8 are waveform diagrams of signals for illustrating operations of a semiconductor memory device according to an embodiment of the present invention.
Figure 8:
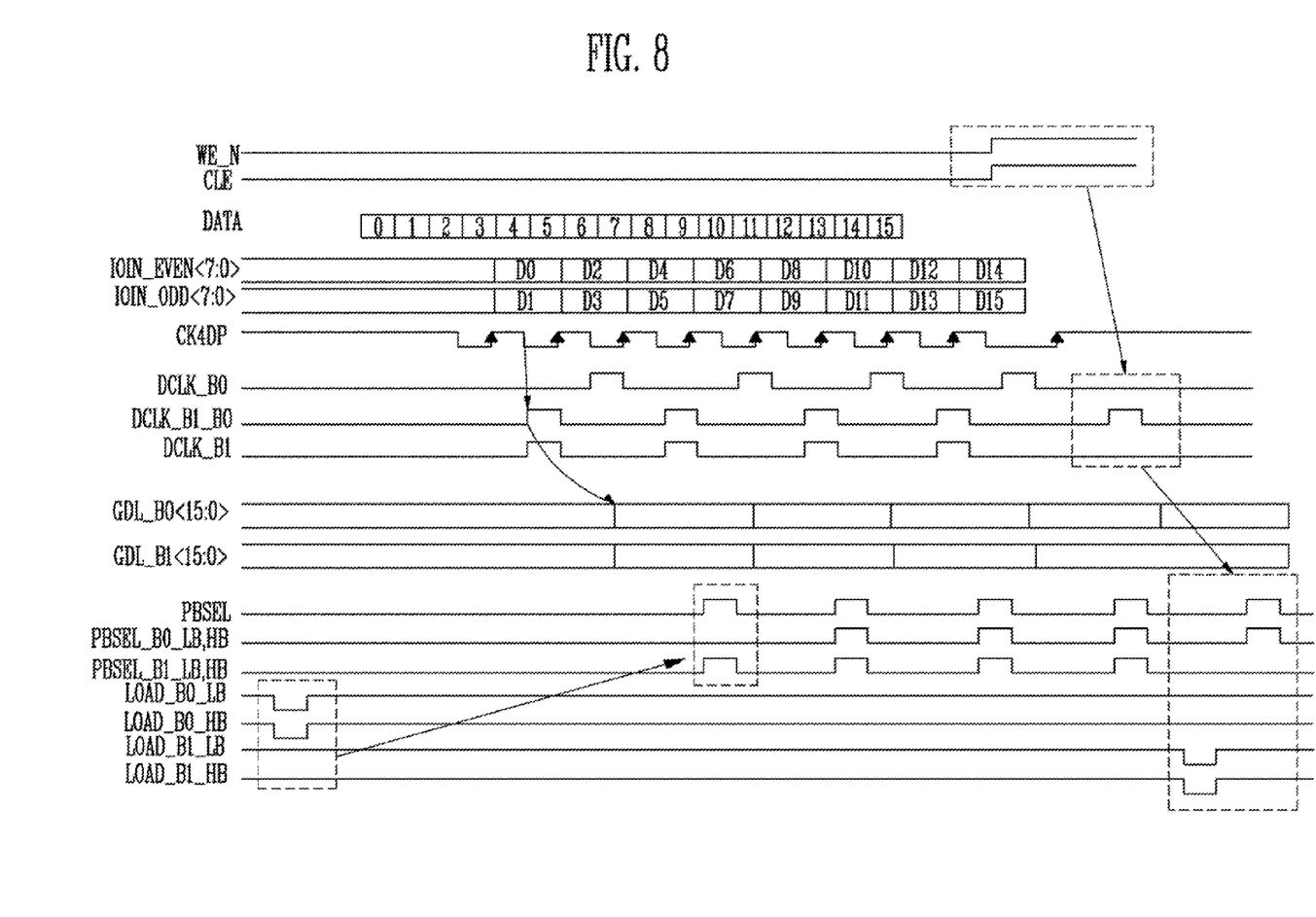

FIGS. 7 and 8 are waveform diagrams of signals for illustrating operations of a semiconductor memory device according to an embodiment of the present invention.

FIG. 7 is a waveform diagram of signals for illustrating a case in which data is input to the first memory bank unit BANK0 and the second memory bank unit BANK1 at the same time during a data input operation.

When the data is input to the first memory bank BANK0 and the second memory bank BANK1 at the same time, a start bank address may correspond to the first memory bank BANK0, and an end bank address may correspond to the second memory bank BANK1. The bank address may be input in response to the address signal ALE. Referring to FIGS. 2 and 7, the command signals WE, CLE and DQS and the address signal ALE for the data input operation may be transferred to the respective components through the input/output pad unit 110. Furthermore, the input/output pad unit 110 may transfer externally input data DATA 0 to 15 as local data D0 to D15 to local data lines IOIN_EVEN<7:0> and IOIN_ODD<7:0>.

The clock generation unit 120 may generate an internal clock CK4DP that toggles at a predetermined period based on the command signals received from the input/output pad unit 110, and generate data input clocks DCLK_B0 and DCLK_B1 by using the internal clock. CK4DP so that the data input clocks DCLK_B0 and DCLK_B1 may have the same period and alternately toggle. When data is input to the first memory bank unit BANK0 and the second memory bank unit BANK1, the data input clock DCLK_B1_B0 may be generated to have the same period and toggle timing as the data input clock DCLK_B1.

The input/output control circuit 130 may transfer the local data D0 to D15, transferred to the first local data lines IOIN_B0<15:0> and the second local data lines IOIN_B1<15:0> to the first global data lines GDL_B0<15:0> and the second global data lines GDL_B1<15:0> based on the command signals received from the input/output pad unit 110 and the data input clocks DCLK_B0, DCLK_B1, and DCLK_B1_B0 generated by the clock generation unit 120.

The address counter unit 140 may count the internal clock CK4DP generated by the clock generation unit 120 to generate a counting signal and generate a column address based on the counting signal and the command signals received from the input/output pad unit 110. The generated column address may be transferred to the first column decoder 160 and the second column decoder 170. The address counter unit 140 may transfer an integrated column address to the first column decoder 160 and the second column decoder 170, rather than different addresses corresponding to the first memory bank unit BANK0 and the second memory bank unit BANK1. Therefore, the address counter unit 140 may be composed of a single counter circuit, thus, the number of address lines coupled to the first column decoder 160 and the second column decoder 170 may be reduced.

The control signal generation circuit 150 may generate the first, second, third, and fourth page buffer selection signals PBSEL_B0_LB, PBSEL_B0_HB, PBSEL_B1_LB, and PBSEL_B1_HB to control the first and second column decoders 160 and 170 based on the command signals input through the input/output pad unit 110. Based on the first, second, third, and fourth page buffer selection signals PBSEL_B0_LB, PBSEL_B0_HB, PBSEL_B1_LB, and PBSEL_B1_HB, the first and second column decoders 160 and 170 may select the first and second page buffer units PB0, PB1, PB2, and PB3 included in the first and second memory bank units BANK0 and BANK1 to input the internal data D0 to D15 that are input through the input/output control circuit 130 to the first and second page buffer units PB0, PB1, PB2, and PB3.

FIG. 8 is a waveform diagram of signals for illustrating a case in which the first memory bank BANK0 and the second memory bank BANK1 have different timings in a data input operation. That is, the case in which data is input only to the second memory bank unit BANK1 at an initial section of the data input operation, and data is input to the first memory bank unit BANK0 at a last section of the data input operation is described below with reference to FIG. 8.

When the data is input only to the second memory bank BANK1 at the initial section of the data input operation and the data is input only to the second memory bank BANK1 at the last section of the data input operation, a start bank address may correspond to the second memory bank BANK1, and an end bank address may correspond to the first memory bank BANK0. Referring to FIGS. 2 to 6 and 8, the command signals WE, CLE and DQS and the address signal ALE for the data input operation may be transferred to the respective components through the input/output pad unit 110. Moreover, the input/output pad unit 110 may transfer the externally input data DATA 0 to 15 as the internal data D0 to D15 to the local data lines IOIN_EVEN<7:0> and IOIN_ODD<7:0>.

The clock generation unit 120 may generate the internal clock CK4DP that toggles at a predetermined period based on the command signals received from the input/output pad unit 110, and generate the data input clocks DCLK_B0 and DCLK_B1 by using the internal clock CK4DP so that the data input clocks DCLK_B0 and DCLK_B1 may have the same period and alternately toggle. When the first memory bank unit BANK0 and the second memory bank input data are input at different timings, the data input clock DCLK_B1_B0 may have the same period and toggle timing as the data input clock DCLK_B1, and toggle based on the command signals WE and CLE that transition at the last section of the data input operation.

The input/output control circuit 130 may transfer the internal data D0 to D15, transferred to the first local data lines IOIN_B0<15:0> and the second local data lines IOIN_B1<15:0>, to the first global data line GDL_B0<15:0> and the second global data line (GDL_B1<15:0>) based on the command signals received from the input/output pad unit 110 and the data input clocks DCLK_B0, DCLK_B1, and DCLK_B1_B0 generated by the clock generation unit 120.

The address counter unit 140 may count the internal clock CK4DP generated by the clock generation unit 120 to generate a counting signal and generate a column address based on the command signals and the counting signal received from the input/output pad unit 110. The generated column address may be transferred to the first column decoder 160 and the second column decoder 170. The address counter unit 140 may transfer an integrated column address to the first column decoder 160 and the second column decoder 170, rather than different addresses corresponding to the first memory bank unit BANK0 and the second memory bank unit BANK1. Therefore, the address counter unit 140 may be composed of a single counter circuit, thus, the number of address lines coupled to the first column decoder 160 and the second column decoder 170 may be reduced.

The control signal generation circuit 150 may generate the first, second, third, and fourth page buffer selection signals PBSEL_B0_LB, PBSEL_B0_HB, PBSEL_B1_LB, and PBSEL_B1_HB to control the first and second column decoders 160 and 170 based on the command signals input through the input/output pad unit 110.

The control signal generation circuit 150 may cause the first selection signal LOAD_B0_LB and the second selection signal LOAD_B0_HB to toggle to a low level to prevent the data from being input to the first memory bank unit. BANK0 at the initial section of the data input operation, so that the first and second page buffer selection signals PBSEL_B0_LB and PBSEL_B0_HB may be prevented from being activated even when the page buffer selection signal PBSEL is activated. Therefore, even when the first column decoder 160 and the second column decoder 170 use the same column address, the data may be prevented from being transferred to the first memory bank unit BANK0.

The control signal generation circuit 150 may cause the third selection signal LOAD_B1_LB and the fourth selection signal LOAD_B1_HB to toggle to a low level to prevent last data from being input to the second memory bank unit BANK1 at the last section of the data input operation, so that the third and fourth page buffer selection signals PBSEL_B1_LB and PBSEL_B1_HB may be prevented from being activated even when the page buffer selection signal PBSEL is activated.

Based on the first, second, third, and fourth page buffer selection signals PBSEL_B0_LB, PBSEL_B0_HB, PBSEL_B1_LB and PBSEL_B1_HB, the first and second column decoders 160 and 170 may select the first and second page buffer units PB0, PB1, PB2, and PB3 included in the first and second memory bank units BANK0 and BANK1 so that the internal data D0 to D15, input through the input/output control circuit 130, may be input to the first and second page buffer units PB0, PB1, PB2, and PB3.

At the last section of the data input operation, the input/output control circuit 130 may transfer last internal data that were transferred to the first local data lines IOIN_B0<15:0>, to the first global data line GDL_B0<15:0> based on the data input clock DCLK_B1.

Figure 9:
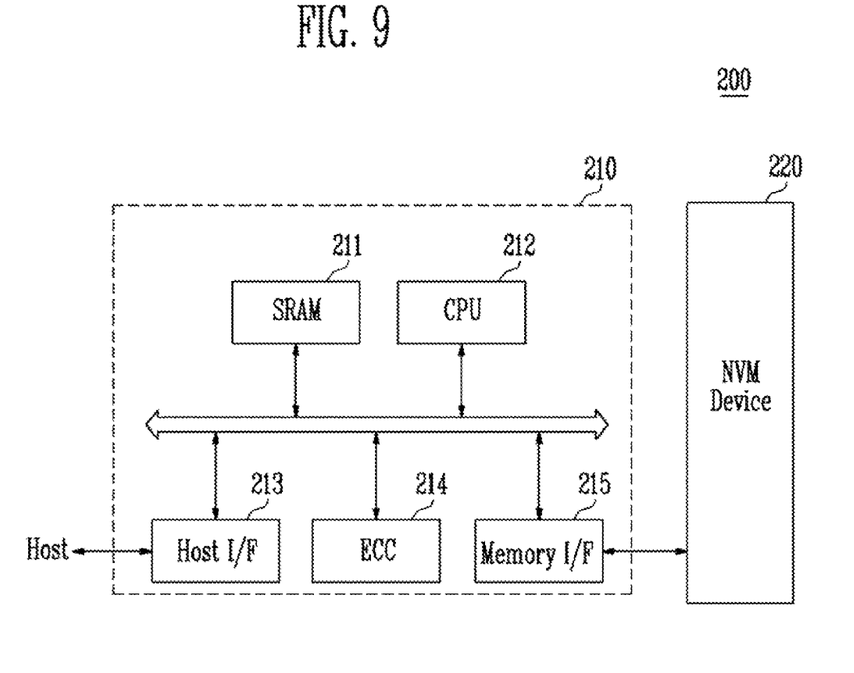
FIG. 9 is a block diagram illustrating a memory system according to an embodiment of the present invention.

FIG. 9 is a block diagram illustrating a memory system 200 according to an embodiment of the present invention.

Referring to FIG. 9, the memory system 200 may include a non-volatile memory device 220 and a memory controller 210.

The non-volatile memory device 220 may configured into the above-described semiconductor memory device and may be operated by the above-described method for compatibility with the memory controller 210. The memory controller 210 may be configured to control the non-volatile memory device 220. The memory system 200 having the above-described configuration may be a memory card or a solid-state disk (SSD) in which the non-volatile memory device 220 and the memory controller 210 are combined. A static RAM (SRAM) 211 may function as an operation memory of a central process unit (CPU) 212. A host interface (I/F) 213 may include a data exchange protocol of a host being coupled to the memory system 200. An error correction code (ECC) 214 may detect and correct errors included in a data read from the non-volatile memory device 220. A memory interface (I/F) 215 may interface with the non-volatile memory device 220. The CPU 212 may perform the general control operation for data exchange of the memory controller 210.

Though not illustrated in FIG. 9, the memory system 200 may further include ROM (not illustrated) that stores code data to interface with the host. Furthermore, the non-volatile memory device 220 may be a multi-chip package composed of a plurality of flash memory chips. The memory system 200 may be provided as a storage medium having high reliability and low error rate. The flash memory according to an embodiment of the present invention may be provided in a memory system such as a semiconductor disk device, for example, a solid-state disk (SSD). That is, when the memory system 200 is an SSD, the memory controller 110 may communicate with the outside, e.g., a host, through one of the interface protocols including USB, MMC, PCI-E, SATA, PATA, SCSI, ESDI and IDE.

Figure 10:
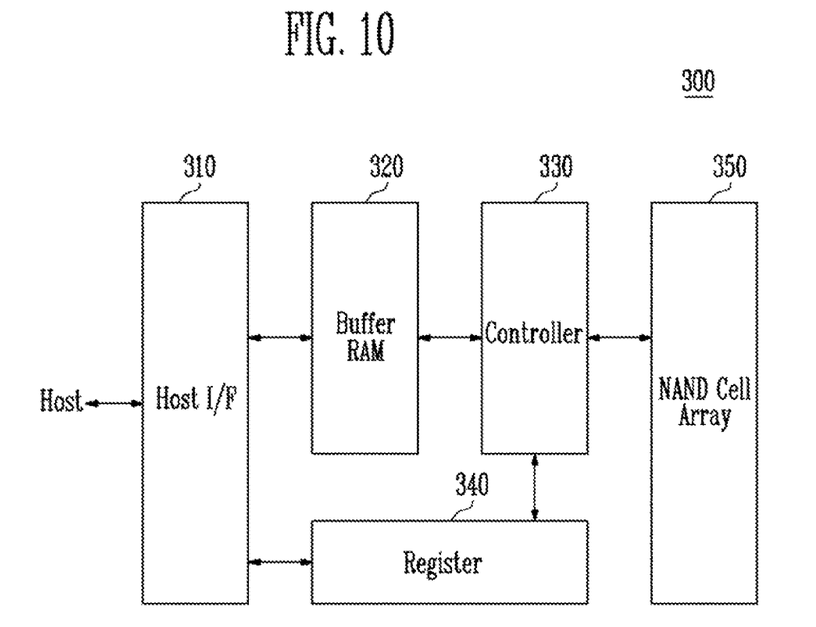
FIG. 10 is a block diagram illustrating an application example of the memory system shown in FIG. 9.

FIG. 10 is a block diagram illustrating a fusion memory device or a fusion memory system according to the aforementioned various embodiments. For example, technical features of the present invention may be applied to a OneNand flash memory 300 as the fusion memory device.

The OneNand flash memory 300 may include a host interface (I/F) 310, a buffer RAM 320, a controller 330, a register 340 and a NAND flash cell array 350. The host interface 310 may be configured to exchange various types of information with a device through a different protocol. The buffer RAM 320 may have built-in codes for driving the memory device or temporarily store data. The controller 330 may be configured to control read and program operations, and every state based on a control signal and a command that are externally given. The register 340 may be configured to store data including instructions, addresses and configurations defining a system operating environment in the memory device. The NAND flash cell array 350 may include operating circuits including non-volatile memory cells and page buffers. Based on a write request from a host, the OneNAND flash memory 300 may program data in the aforementioned manner.

Figure 11:
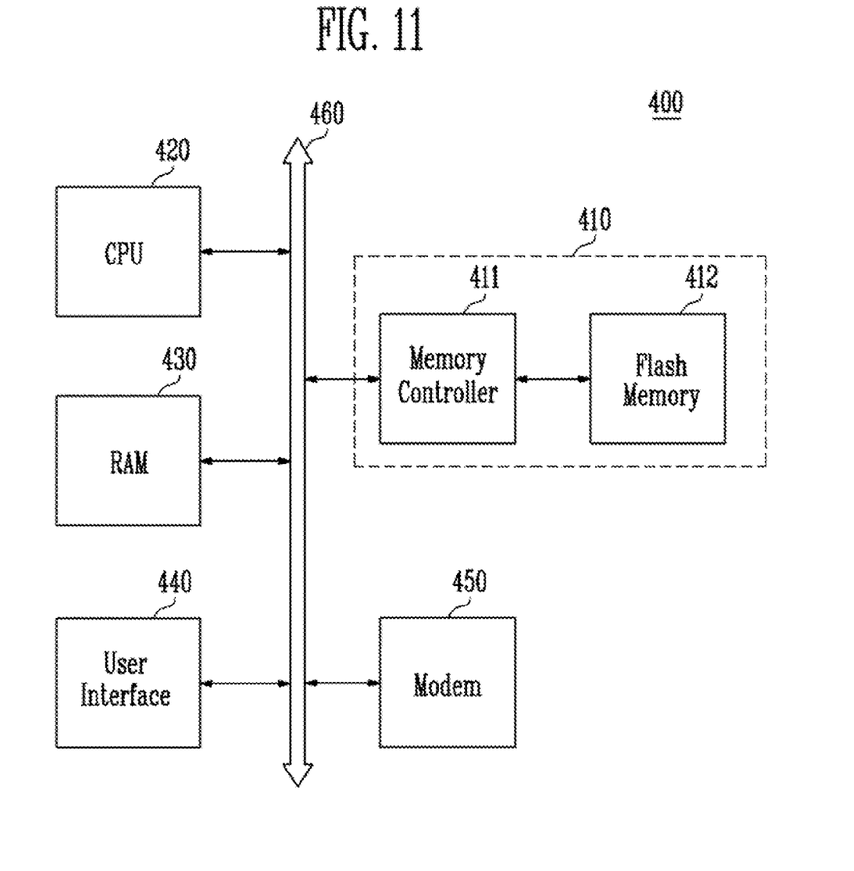
FIG. 11 is a block diagram illustrating a computing system including the memory system described with reference to FIG. 10.

FIG. 11 is a block diagram of a computing system 400 according to an embodiment of the present invention.

The computing system 400 may include a CPU 420, RAM 430, a user interface 440, a modem 450, such as a baseband chipset, and a memory system 410 that are electrically coupled to a system bus 460. If the computing system 400 is a mobile device then a battery may be provided to apply operating voltages to the computing system 400. The memory system 410 may include a memory controller 411 and a flash memory device 412. Though not shown in FIG. 11, the computing system 400 may further include application chipsets, a camera image processor, or mobile DRAM. The memory system 410 may form a solid-state drive (SSD) that uses a non-volatile memory to store data. The memory system 410 may be provided as a fusion flash memory, e.g., a OneNAND flash memory.

According to an embodiment of the present invention, since input control circuits corresponding to a plurality of memory banks in a semiconductor memory device are integrated into a single control circuit, the size of the data input circuit included in the semiconductor memory device may be reduced to increase a degree of the integration of the semiconductor memory device and to reduce power consumption.

Various embodiments described above are not limited to a device and a method but are implemented through program implementing functions corresponding to the features of embodiments or a non-transitory, computer-readable recording medium where the program is recorded. Such implementation is easily done by a person of ordinary skill in the art based on the description of the embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment are used singly or in combination with features, characteristics, and/or elements described in connection with other embodiments unless otherwise specifically indicated. Although embodiments have been described with reference to a number of illustrative embodiments thereof, it should be understood that numerous other modifications and various embodiments can be devised by those skilled in the art that will fall within the spirit and scope of the claimed invention as set forth in the following claims.

What is claimed is:

1. A semiconductor memory device, comprising:
   a first page buffer block included in a first memory bank and a second page buffer block included in a second memory bank;
   an input/output control circuit suitable for transferring input data to data lines;
   a first column decoder and a second column decoder suitable for selecting the first page buffer block included in the first memory bank and the second page buffer block included in the second memory bank, respectively, to latch the input data transferred through the data lines, based on a plurality of page buffer selection signals and a column address transferred through address lines that are shared by the first and second column decoders; and
   a control signal generation circuit suitable for generating the plurality of page buffer selection signals,
   wherein data is input to the first and second memory banks at the same time when a first memory bank address corresponding to the first memory bank is input before a second memory bank address corresponding to the second memory bank is input, and a data input operation of the second memory bank is performed before a data input operation of the first memory bank when the second memory bank address is input before the first memory bank address is input.

2. The semiconductor memory device of claim 1, further comprising a clock generation unit suitable for generating an internal clock and data input clocks based on a command signal.

3. The semiconductor memory device of claim 2, further comprising an address counter suitable for counting the internal clock to generate the column address based on the command signal, and transferring the column address to the first and second column decoders through the address lines.

4. The semiconductor memory device of claim 1, wherein the control signal generation circuit activates the page buffer selection signals to select the first and second page buffer blocks when data is input to the first memory bank and the second memory bank at the same time during a data input operation.

5. The semiconductor memory device of claim 1, wherein the control signal generation circuit activates the page buffer selection signals to select a page buffer block included in a selected memory bank among the first and second page buffer blocks when one of the first memory bank and the second memory bank is selected during a data input operation.

6. The semiconductor memory device of claim 1, wherein the input/output control circuit comprises:
   a first data line control unit suitable for transferring the input data to first data lines corresponding to the first memory bank; and
   a second data line control unit suitable for transferring the internal data to second data lines corresponding to the second memory bank.

7. The semiconductor memory device of claim 6, wherein the first data line control unit includes a plurality of first data control units suitable for transferring the input data to the first data lines based on first and second data input clocks.

8. The semiconductor memory device of claim 7, wherein the second data line control unit includes a plurality of second data control units suitable for transferring the input data to the second data lines based on a third data input clock.

9. The semiconductor memory device of claim 8, wherein the first data input clock and the third data input clock have a same period and alternately toggle.

10. The semiconductor memory device of claim 8, wherein the second data input clock toggles one more time than the first data input clock at a last section of a data input operation.

11. A semiconductor memory device, comprising:
    a first memory bank and a second memory bank each including a memory unit and a page buffer unit;
    an input/output pad unit suitable for receiving an input data, a command signal, and an address signal;
    a first column decoder and a second column decoder suitable for controlling data latch operations of page buffer units of the first memory bank and the second memory bank, respectively, based on a plurality of page buffer selection signals and a column address;
a control signal generation circuit suitable for generating the page buffer selection signals;
an address counter suitable for transferring the column address through an address line shared by the first and second column decoders; and
an input/output control circuit suitable for transferring the input data to a data line coupled to the page buffer units of the first and second memory banks,
wherein the input/output control circuit comprises:
a first data line control unit suitable for transferring the input data to first data lines corresponding to the first memory bank, the first data line control unit including a plurality of first data control units suitable for transferring the input data to the first data lines based on first and second data input clocks; and
a second data line control unit suitable for transferring the internal data to second data lines corresponding to the second memory bank, the second data line control unit including a plurality of second data control units suitable for transferring the internal data to second data lines based on a third data input clock.

12. The semiconductor memory device of claim 11, further comprising a clock generation unit suitable for generating an internal clock and data input clocks based on the command signal.

13. The semiconductor memory device of claim 11, wherein the control signal generation circuit activates the page buffer selection signals to select the first and second page buffer units when data is input to the first memory bank and the second memory bank at the same time during a data input operation.

14. The semiconductor memory device of claim 11, wherein the control signal generation circuit activates the page buffer selection signals to select the page buffer unit corresponding to a selected memory bank among the first and second page buffer units when one of the first memory bank and the second memory bank is selected during a data input operation.

15. A semiconductor memory device, comprising:
a plurality of memory bank units each including a memory unit and a page buffer unit;
a plurality of column decoders corresponding to the respective memory bank units and each suitable for controlling a data latch operation of the corresponding page buffer unit based on a column address and page buffer selection signals;
a control signal generation circuit suitable for generating the page buffer selection signals to activate data latch operations of the page buffer units, based on a command signal;
an address counter suitable for counting an internal clock to generate the column address and transferring the column address through an address line shared by the column decoders; and
a clock generation unit suitable for generating the internal clock and first to third data input clocks based on the command signal.

16. The semiconductor memory device of claim 15, further comprising an input/output control circuit suitable for transferring input data to data lines coupled to the respective page buffer units based on the first to third data input clocks.

17. The semiconductor memory device of claim 16, wherein the input/output control circuit includes a plurality of data line control units suitable for transferring the input data to the data lines corresponding to the respective memory bank units.

18. A semiconductor memory device, comprising:
a first page buffer block included in a first memory bank and a second page buffer block included in a second memory bank;
an input/output control circuit suitable for transferring input data to data lines;
a first column decoder and a second column decoder suitable for selecting the first page buffer block included in the first memory bank and the second page buffer block included in the second memory bank, respectively, to latch the input data transferred through the data lines, based on a plurality of page buffer selection signals and a column address transferred through address lines that are shared by the first and second column decoders; and
a control signal generation circuit suitable for generating the plurality of page buffer selection signals,
wherein the input/output control circuit comprises:
a first data line control unit suitable for transferring the input data to first data lines corresponding to the first memory bank, the first data line control unit including a plurality of first data control units suitable for transferring the input data to the first data lines based on first and second data input clocks; and
a second data line control unit suitable for transferring the internal data to second data lines corresponding to the second memory bank, the second data line control unit including a plurality of second data control units suitable for transferring the input data to the second data lines based on a third data input clock.

* * * * *